United States Patent [19]
Chen et al.

[11] Patent Number: 5,994,233
[45] Date of Patent: Nov. 30, 1999

[54] OXIDE ETCHING METHOD

[75] Inventors: Tong-Yu Chen, Hsinchu; Chan-Lon Yang, Taipei; Tsu-An Lin, Taichung, all of Taiwan

[73] Assignee: United Microelectronics Corp., Hsinchu, Taiwan

[21] Appl. No.: 09/172,507

[22] Filed: Oct. 14, 1998

[30] Foreign Application Priority Data

Aug. 24, 1998 [TW] Taiwan ................................. 87113888

[51] Int. Cl.⁶ ..................... H01L 21/00; H01L 21/3065
[52] U.S. Cl. ............................................................ 438/706
[58] Field of Search ..................... 438/706, 639, 438/723

[56] References Cited

U.S. PATENT DOCUMENTS 5,227,014  7/1993  Crotti et al. ............................. 438/715
5,595,627  1/1997  Inazawa .................................. 438/701

*Primary Examiner*—Benjamin Utech
*Assistant Examiner*—Lynette T. Umez-Eronini
*Attorney, Agent, or Firm*—Thomas, Kayden, Horstemeyer & Risley

[57] ABSTRACT

An oxide etching method using low-medium density plasma includes a first etching step to pre-etch the oxide layer with low etching selectivity etchant to pre-form a contact opening and a monitoring opening. The low etching selectivity etchant can also etch the photoresist layer and the photoresist reaction residue. Then, a second etching with high etching selectivity on the oxide is performed to completely form the contact opening with a SAC property and the monitoring opening. The openings expose the substrate.

11 Claims, 2 Drawing Sheets

OXIDE ETCHING METHOD

CROSS REFERENCE TO RELATED APPLICATION

This application claims the priority benefity of Taiwan application Ser. No. 87113888, filed Aug. 24, 1998.

BACKGROUND OF THE INVENTION

1. Field of the Invention

This invention relates to an oxide etching method, and more particularly to a method of etching oxide using low-medium density plasma to form a self-aligned contact (SAC).

2. Description of Related Art

In the current semiconductor fabrication processes, because the integration of an integrated circuit (IC) is very high, an IC chip no longer has adequate surface area for making the large number of required interconnects. In order to make the required interconnects used for connecting large numbers of reduced-dimension metal-oxide semiconductor (MOS) transistors, an IC design including two metal layers of interconnects is gradually becoming widely used. A contact opening for electrically connecting the metal layers has therefore been developed.

However, because the distance between each element in the MOS device is usually quite small, misalignment often occurs during pattern transfer. This causes unexpected etching on the metal layers in a subsequent etching process and results in a short circuit or current leakage. A self-aligned contact (SAC) has therefore been developed to solve the misalignment problem.

Current semiconductor technology has achieved sub-micron dimensions. Under this technology, the formation of SAC is more critical to the fabrication of a logic device, a DRAM device or a SRAM device. The SAC can currently be formed by low-medium density plasma oxide etchings, such as magnetic enhanced reactive ion etching (MERIE), reactive ion etching (RIE), or IEM.

FIG. 1A and FIG. 1B are cross-sectional views schematically illustrating a conventional oxide etch using low-medium density plasma. In FIG. 1A, a gate 102 with a spacer 104 on both sides is formed over a semiconductor substrate 100. The gate 102 in the conventional example is schematically shown as two gates 102. The spacer 104 includes, for example, silicon nitride. Next, an oxide layer 106 is formed over the substrate 100 by, for example, chemical vapor deposition (CVD). Next, a photoresist layer (not shown) is coated over the oxide layer 106 and is patterned to form a first photoresist layer 108a, which covers the gates 102 region, and a second photoresist layer 108b. The first photoresist layer 108a has an opening 109a, located above and between the gates 102. The second photoresist layer 108b has a wider opening 109b.

In FIG. 1A and FIG. 1B, the oxide layer 106 is patterned, according to the first photoresist layer 108a, to form a contact opening 110, which exposes the substrate 100 and the spacer 104 between the gates 102. The oxide layer 106 is patterned, according to the second photoresist layer 108b, to form a monitoring opening 112, which is wider than the contact opening 110. The patterning process includes, for example, using a MERIE oxide etching with an etchant of a mixed gas of $C_4F_8$/CO/Ar. This mixed gas has a higher etching selectivity on the oxide layer 106 than on the spacer 104 so that the spacer 104 remains intact.

The photoresist layer 108a and 108b are usually made of polymer, and polymer can react with the etchant to produce carbolic particles which get dumped into the monitoring opening 112. A micro-loading may then occur in the monitoring opening 112 which degrades the subsequent etching efficiency so that the monitoring opening 112 as shown in FIG. 1B doesn't expose the substrate 100 and the daily quality measurement cannot effectively be monitored. The end result is that the IC chip quality cannot be effectively controlled.

SUMMARY OF THE INVENTION

It is therefore an objective of the present invention to provide a method to etch oxide using low-medium density plasma. The method can prevent micro-loading from occurring in a monitoring opening and ensure the effective monitoring of daily quality measurement.

In accordance with the foregoing and other objectives of the present invention, a method to etch oxide using low-medium density plasma follows. After an oxide layer and a photoresist layer with a desired pattern are sequentially formed over a semiconductor substrate, a first etching on the oxide layer is performed. The first etching includes a magnetic enhanced reactive ion etching (MERIE) with a low etching selectivity etchant. A portion of the oxide layer not covered by the photoresist layer is etched to pre-form a SAC opening and a monitoring opening. Because of the low etching selectivity etchant, the photoresist layer is also etched, becomes thinner, and the reaction residue between the etchant and the photoresist is also etched out. Consequently, microloading is prevented and the aspect ratio is reduced, the aspect ratio being the ratio of depth to width. Then a second etching is performed to completely form the SAC opening and the monitoring opening, in which the openings expose the substrate. The second etching includes an etchant with high etching selectivity on the oxide and uses a lower radio frequency (RF) etching power. Because the aspect ratio is reduced after the first etching, the lower RF etching power is adequate. Moreover, in the invention, because these two steps of etching are sequentially performed without a power break, the production throughput would not be delayed and the micro-loading phenomenon can be avoided.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
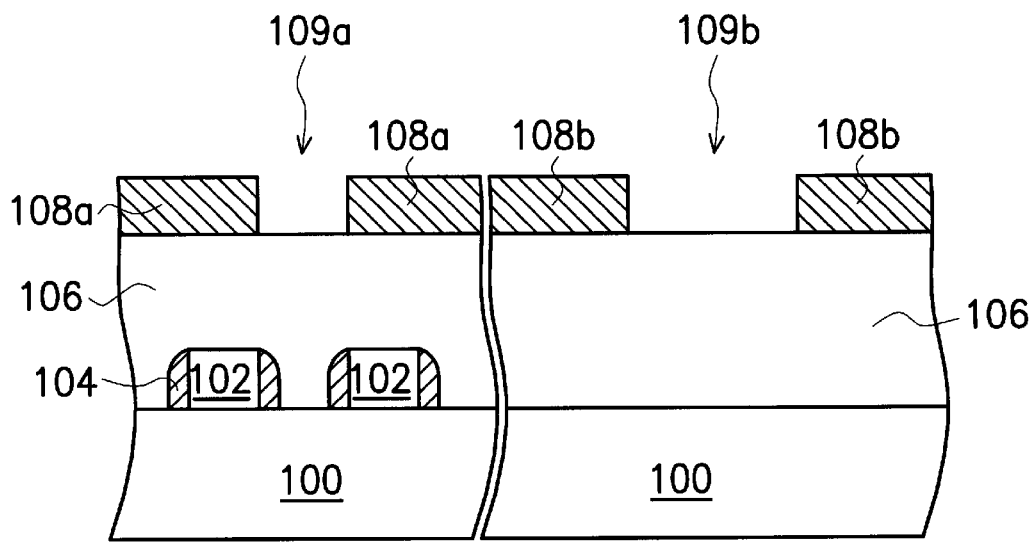
FIG. 1A and FIG. 1B are cross-sectional views schematically illustrating a conventional oxide etching procedure using low-medium density plasma.
Figure 1B:
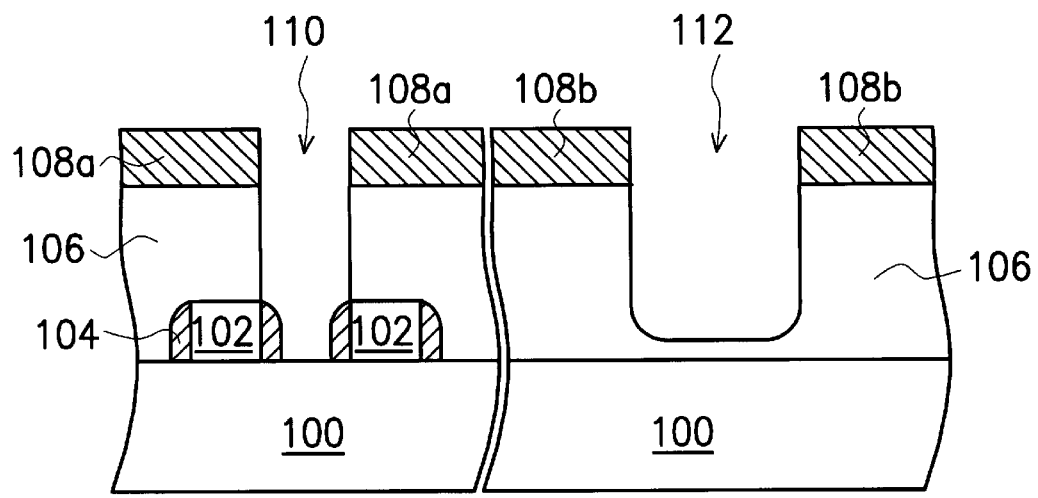
Figure 2:
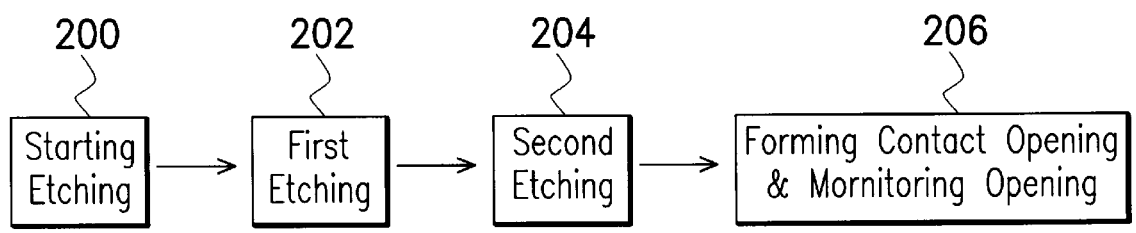
FIG. 2 is a flow diagram schematically illustrating an oxide etching procedure according to a preferred embodiment of the invention.

FIG. 2 is a flow diagram schematically illustrating an oxide etching procedure according to a preferred embodiment of the invention. Referring to FIG. 2, when one wants to form a contact opening and a monitoring opening on a semiconductor substrate, an etching procedure starts at a first step 200. The next step is a first etching 202, which includes a low etching selectivity etchant. The first etching 202 pre-etches the contact opening and the monitoring opening. Following that is a second etching 204, which includes a low RF etching power and an etchant with a higher etching selectivity on silicon oxide than on silicon nitride. The transition from the first etching 202 to the second etching 204 has no power break. The second etching 204 continuously etches the openings until the openings expose the substrate so that the contact opening and the monitoring opening are completely formed as shown in step 206.

Figure 3A:
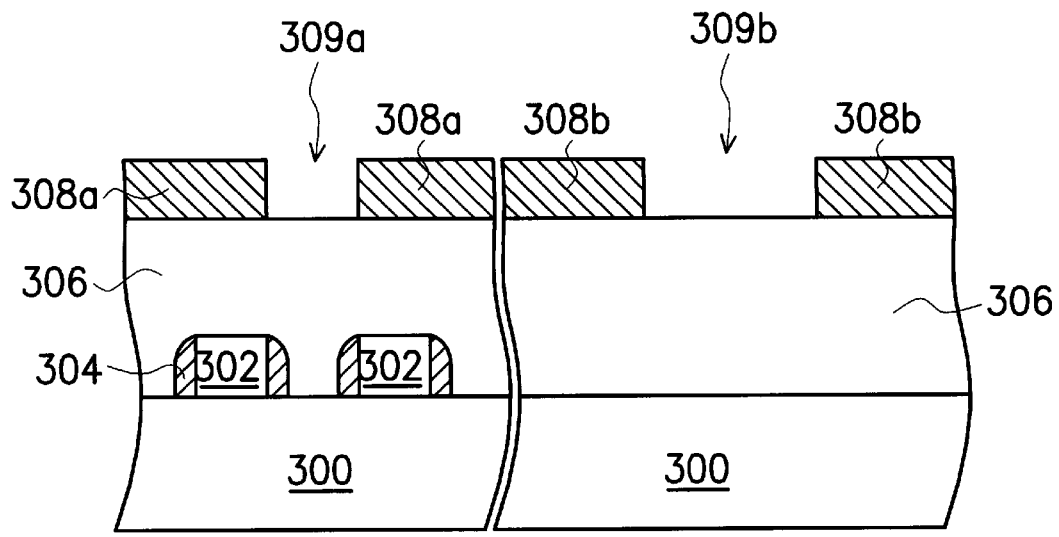
FIGS. 3A–3C are cross-sectional views schematically illustrating an oxide etching procedure using low-medium density plasma, according to the preferred embodiment of the invention.
Figure 3B:
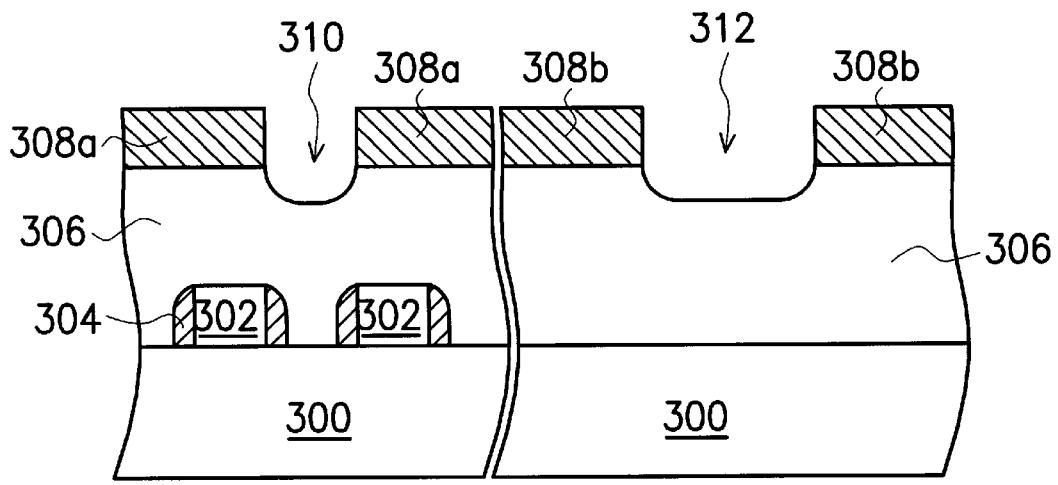
Figure 3C:
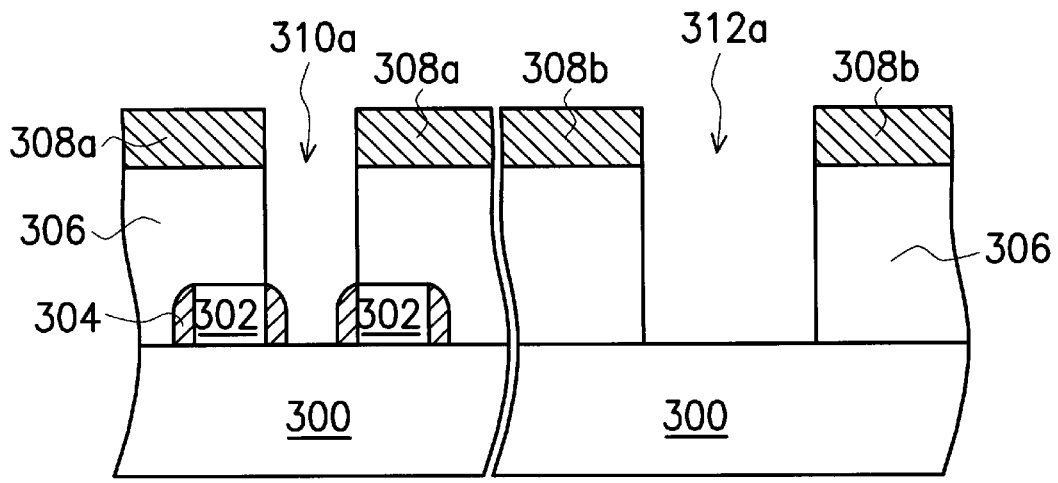

FIGS. 3A–3C are cross-sectional views schematically illustrating an oxide etching procedure using low-medium density plasma, according to the preferred embodiment of the invention.

In FIG. 3A, a gate 302 with a spacer 304 on both sides is formed over a semiconductor substrate 300. The gate 302 in this example is schematically shown as two gates 302. The spacer 304 includes, for example, silicon nitride. Next, an oxide layer 306 including, for example, silicon oxide is formed over the substrate 300 by, for example, chemical vapor deposition (CVD). Next, a photoresist layer (not shown) is coated over the oxide layer 306 and is patterned to form a first photoresist layer 308a, which covers the gates 302 region, and a second photoresist layer 308b. The first photoresist layer 308a has a first opening 309a located between the gates 302 in horizontal scale. The second photoresist layer 308b has a second, wider opening 309b.

Referring to FIG. 2, FIG. 3A, and FIG. 3B, the first etching 202 is performed according to the photoresist layer 308a and the photoresist layer 308b so that the oxide layer 306 is patterned to pre-form a contact opening 310 and a monitoring opening 312, without exposing the substrate 300. The contact opening 310 and the monitoring opening 312 respectively correspond to the first opening 309a and the second opening 309b. The first etching 202 includes a low etching selectivity etchant, such as a mixed gas of $C_4F_8/O_2/CO/Ar$, with a low etching selectivity property on the oxide layer. The etching process, for example, can be MERIE, RIE, or IEM. Because of the use of the low etching selectivity etchant, the photoresist layers 308a, 308b are thinned because of being etched on the top portion else, which results in aspect ratio reduction in the contact opening 310 and the monitoring opening 312. This makes the subsequent second etching 204 much easier. Furthermore, the reaction residue, which includes carbolic particles, located between the etchant and the photoresist, is also etched out, thus avoiding the micro-loading phenomenon.

Referring to FIG. 2 and FIG. 3C, the second etching 204 is performed next, to completely form a contact window 310a and a monitoring opening 312a, in which the openings 310a and 312a expose the substrate 300. There is no micro-loading occurring. The etchant used in the second etching 204 is, for example, a mixed gas of $C_4F_8/CO/Ar$, but with a higher etching selectivity on the oxide layer 306 than on the spacer 304, which includes silicon nitride. The etching selectivity ratio is at least about 10. So, the contact opening 310a has a SAC property and the spacer 304 remains in the contact opening 310a. The etching process is the same as the one used in the first etching 202 but the etching plasma power is, for example, transmitted to a low radio frequency (RF) power without a power break. The low RF power is adequate for etching because the aspect ratio is reduced after the first etching 202. Since the monitoring opening 312a exposes the substrate, the daily quality measurement can be effectively carried out for monitoring and controlling the IC chip production.

In conclusion, the oxide etching method in the invention is characterized as follows:

1. A low etching selectivity etchant is used in the first etching 202 so that the photoresist layers 308a, 308b are thinned, creating a small aspect ratio, which makes it easier for the second etching 204, and the reaction residue can be eliminated to avoid micro-loading.

2. Because of the reduced aspect ratio, the second etching 204 can use low RF etching plasma power. The high etching selectivity etchant used for the second etching 204 provides the contact opening 310a with the SAC property.

3. The two etching steps 202, 204 are sequentially performed without a power break so that the throughput can be maintained and the dumping of reaction residue, including carbolic particles, into the monitoring opening during the transition between the two etching procedures 202, 204, is avoided.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. An oxide etching method applied on a semiconductor substrate, on which a gate with a spacer on a gate side periphery are first formed and then an oxide layer is formed over the substrate, the oxide etching method comprising:

forming a photoresist layer over the oxide layer, wherein the photoresist layer has a first pattern used to pattern a contact opening relative to the gate, and a second pattern used to pattern a general-use opening;

performing a first etching over the substrate to etch the oxide layer with a low etching selectivity etchant, using the photoresist layer as a mask, to pre-form the contact opening and the general-use opening, wherein the openings do not expose the substrate, and a top portion of the photoresist layer is etched also so as to cause the photoresist layer to be thinner, and wherein the low etching selectivity etchant used in the first etching comprises a mixed gas of $C_4F_8/O_2/CO/Ar$; and performing a second etching over the substrate, continuously using the photoresist layer as a mask, to etch the oxide layer with a high etching selectivity etchant to form the contact opening and the general-use opening, in which the openings expose the substrate, and wherein the high etching selectivity etchant comprises a mixed gas of $C_4F_8/CO/Ar$.

2. The oxide etching method of claim 1, wherein the spacer comprises silicon nitride.

3. The oxide etching method of claim 1, wherein the first etching and the second etching comprise a low-medium density plasma etching process.

4. The oxide etching method of claim 1, wherein the first etching and the second etching comprise a magnetic enhanced reactive ion etching (MERIE) process.

5. The oxide etching method of claim 1, wherein the first etching and the second etching comprise a reactive ion etching (RIE) process.

6. The oxide etching method of claim 1, wherein the first etching and the second etching comprise an IEM process.

7. The oxide etching method of claim 1, wherein the second etching comprises a low radio frequency (RF) power.

8. The oxide etching method of claim 1, wherein the high etching selectivity etchant used in the second etching comprises an etching selectivity ratio of the oxide layer to the spacer of at least about 10.

9. The oxide etching method of claim 1, wherein in the step of performing the first etching, the photoresist layers are thinned and a reaction residue, located between the photoresist layer and the used etchant is removed.

10. The oxide etching method of claim 1, wherein the general-use opening comprises a monitoring opening.

11. A method of forming a monitoring opening, which is applied on a substrate, the method comprising:

forming an oxide layer over the substrate;

forming a photoresist layer on the oxide layer with a monitoring pattern;

performing a first etching to pre-etch the oxide layer using the photoresist layer a mask, wherein a top portion of the photoresist layer is also etched away, wherein the first etching comprises a low etching selectivity etchant between the oxide layer and the photoresist layer, and wherein the low etching selectivity etchant comprises a mixed gas of $C_4F_8/O_2/CO/Ar$ and;

performing a second etching to continuously etch the oxide layer so as to expose the substrate, wherein the photoresist layer is used as a mask, wherein the second etching comprises a high etching selectivity etchant on the oxide layer, and wherein the high etching selectivity etchant comprises a mixed gas of $C_4F_8/CO/Ar$.

\* \* \* \* \*